United States Patent
Dhanyamraju et al.

(10) Patent No.: US 11,501,200 B2
(45) Date of Patent: Nov. 15, 2022

(54) GENERATE ALERTS WHILE MONITORING A MACHINE LEARNING MODEL IN REAL TIME

(71) Applicant: HCL Technologies Limited, Uttar Pradesh (IN)

(72) Inventors: S U M Prasad Dhanyamraju, Hyderabad (IN); Satya Sai Prakash Kanakadandi, Hyderabad (IN)

(73) Assignee: HCL Technologies Limited, Noida (IN)

( * ) Notice: Subject to any disclaimer, the term of this patent is extended or adjusted under 35 U.S.C. 154(b) by 808 days.

(21) Appl. No.: 15/627,200

(22) Filed: Jun. 19, 2017

(65) Prior Publication Data
US 2018/0005139 A1     Jan. 4, 2018

(30) Foreign Application Priority Data
Jul. 2, 2016 (IN) ............................. 201611022817

(51) Int. Cl.
| | |
|---|---|
| *G06N 20/00* | (2019.01) |
| *G08B 21/18* | (2006.01) |
| *G06F 30/20* | (2020.01) |

(52) U.S. Cl.
CPC ............. *G06N 20/00* (2019.01); *G06F 30/20* (2020.01); *G08B 21/18* (2013.01)

(58) Field of Classification Search
CPC ........ G06N 20/00; G06N 5/025; G06N 7/005; G06K 9/6256; G06K 9/6269
USPC .......................................................... 706/12
See application file for complete search history.

(56) References Cited

U.S. PATENT DOCUMENTS

| | | | |
|---|---|---|---|
| 8,527,435 B1 * | 9/2013 | Han | ..................... A61B 5/7267 706/12 |
| 8,688,603 B1 | 4/2014 | Kurup et al. | |
| 10,417,577 B2 * | 9/2019 | Bowers | ................... G06F 9/453 |
| 10,445,152 B1 * | 10/2019 | Zhang | ................. G06F 16/1744 |
| 2016/0162779 A1 * | 6/2016 | Marcus | .................. G06N 20/00 706/12 |
| 2016/0253672 A1 * | 9/2016 | Hunter | ............... G06Q 20/4016 705/39 |
| 2016/0300156 A1 * | 10/2016 | Bowers | ............... G06F 16/2465 |

(Continued)

FOREIGN PATENT DOCUMENTS

WO    WO-2012092649 A1 * 7/2012 ............. G06Q 10/10

OTHER PUBLICATIONS

Shane Bergsma, "Large-Scale Semi-Supervised Learning for Natural Language Processing", 2010, pp. 137.

*Primary Examiner* — Viker A Lamardo
(74) *Attorney, Agent, or Firm* — Kendal Sheets (57) ABSTRACT

The present disclosure relates to system(s) and method(s) to generate alerts while monitoring a machine learning model in real time. The system is configured to receive, in response to a first input parameter, a first output parameter generated by a first function of a learning model corresponding to a machine learning model. The system is further configured to receive, in response to a second input parameter, a second output parameter generated by a second functionality of a real-time model corresponding to the machine learning model. Further, the system is configured to compare the first output parameter with the second output parameter and the first input parameter with the second input parameter to generate tuning and rebuilding alerts.

5 Claims, 3 Drawing Sheets

(56) References Cited

U.S. PATENT DOCUMENTS

| | | | | |
|---|---|---|---|---|
| 2016/0314245 | A1* | 10/2016 | Silver | G16B 10/00 |
| 2017/0266501 | A1* | 9/2017 | Sanders | A43B 3/0005 |
| 2017/0339021 | A1* | 11/2017 | Dukatz | H04L 41/145 |
| 2019/0180153 | A1* | 6/2019 | Buckler | G06K 9/6296 |
| 2020/0050443 | A1* | 2/2020 | Edelsten | G06F 8/71 |
| 2020/0050938 | A1* | 2/2020 | Fu | G06Q 50/30 |

* cited by examiner

GENERATE ALERTS WHILE MONITORING A MACHINE LEARNING MODEL IN REAL TIME

CROSS-REFERENCE TO RELATED APPLICATIONS AND PRIORITY

The present application claims priority from Indian Patent Application No. 201611022817 filed on 2 Jul. 2016 the entirety of which is hereby incorporated by reference.

TECHNICAL FIELD

The present disclosure in general relates to the field of machine learning. More particularly, the present invention relates to generating alerts while monitoring a machine learning model in real time.

BACKGROUND

Machine learning is an elusive and elite subject demanding special skill and steeper acquisition curve. Current machine learning engines target to build offline learning models and deploy them when they are acceptable and accurate. With streaming data and demand for real time analytics, it is imperative to monitor machine learning models in real time and take appropriate actions based on the continuous monitoring.

State of the art academic research and commercial analytics tools available are configured to address the problem of updating ML Model in some use cases such as fraud detection, sales forecast and failure prediction. However, these solutions are not real-time monitoring solutions and require a lot of human intervention in order to monitor the ML model. Further, with the introduction of new live data, there are chances that tuning of the ML model is necessary. Further, there are no means by which, a user of the ML model can determine the accuracy of the ML model in real-time. Further, there is no set process in order to determine accuracy of an ML model which is functioning in real-time.

SUMMARY

This summary is provided to introduce aspects related to systems and methods for generate alerts while monitoring a machine learning model in real time and the aspects are further described below in the detailed description. This summary is not intended to identify essential features of the claimed subject matter nor is it intended for use in determining or limiting the scope of the claimed subject matter.

In one embodiment, a system to generate alerts while monitoring a machine learning model in real time is illustrated. The system comprises a processor coupled to a memory, wherein the processor is configured to execute programmed instructions stored in the memory. The processor may execute a programmed instruction stored in the memory for receiving, in response to a first input parameter, a first output parameter generated by a first function of a learning model corresponding to a machine learning model. The processor may further execute a programmed instruction stored in the memory for receiving, in response to a second input parameter, a second output parameter generated by a second functionality of a real-time model corresponding to the machine learning model. In one embodiment, the first functionality and the second functionality are configured to perform a same function. The processor may further execute a programmed instruction stored in the memory for comparing the first output parameter with the second output parameter to determine an output variation score. In one embodiment, the comparison is based on a data type corresponding to the first output parameter and the second output parameter. The processor may further execute a programmed instruction stored in the memory for comparing the first input parameter with the second input parameter to determine an input variation score. In one embodiment, the comparison is based on a data type corresponding to the first input parameter and the second input parameter. The processor may further execute a programmed instruction stored in the memory for generating a tuning alert to tune the machine learning model, when the output variation score is above a first threshold value. The processor may further execute a programmed instruction stored in the memory for generating a model rebuilding alert to rebuild the machine learning model, when the input variation score is above a second threshold value.

In one embodiment, a method to generate alerts while monitoring a machine learning model in real time is illustrated. The method may comprise receiving, in response to a first input parameter, a first output parameter generated by a first function of a learning model corresponding to a machine learning model. The method may further comprise receiving, in response to a second input parameter, a second output parameter generated by a second functionality of a real-time model corresponding to the machine learning model. In one embodiment, the first functionality and the second functionality are configured to perform a same function. The method may further comprise comparing the first output parameter with the second output parameter to determine an output variation score. In one embodiment, the comparison is based on a data type corresponding to the first output parameter and the second output parameter. The method may further comprise comparing the first input parameter with the second input parameter to determine an input variation score. In one embodiment, the comparison is based on a data type corresponding to the first input parameter and the second input parameter. The method may further comprise generating a tuning alert to tune the machine learning model, when the output variation score is above a first threshold value. The method may further comprise generating a model rebuilding alert to rebuild the machine learning model, when the input variation score is above a second threshold value.

In one embodiment, a non-transitory computer readable medium embodying a program executable in a computing device to generate alerts while monitoring a machine learning model in real time is illustrated. The program comprises a program code for receiving, in response to a first input parameter, a first output parameter generated by a first function of a learning model corresponding to a machine learning model. The program comprises a program code for receiving, in response to a second input parameter, a second output parameter generated by a second functionality of a real-time model corresponding to the machine learning model. In one embodiment, the first functionality and the second functionality are configured to perform a same function. The program comprises a program code for comparing the first output parameter with the second output parameter to determine an output variation score. In one embodiment, the comparison is based on a data type corresponding to the first output parameter and the second output parameter. The program comprises a program code for comparing the first input parameter with the second input parameter to determine an input variation score. In one embodiment, the comparison is based on a data type corresponding to the first input parameter and the second input parameter. The program comprises a program code for generating a tuning alert to tune the machine learning model, when the output variation score is above a first threshold value. The program comprises a program code for generating a model rebuilding alert to rebuild the machine learning model, when the input variation score is above a second threshold value.

BRIEF DESCRIPTION OF DRAWINGS

The detailed description is described with reference to the accompanying figures. In the figures, the left-most digit(s) of a reference number identifies the figure in which the reference number first appears. The same numbers are used throughout the drawings to refer like features and components.

DETAILED DESCRIPTION

The present disclosure relates to a real time Machine Learning (ML) Model Monitoring System hereafter referred to as the system. The system is configured to generate alerts while monitoring a machine learning model in real time. The system aims to ensure the Machine Learning (ML) model accuracy in production environments with live users and active streaming data. The system discloses a novel and unique approach of analyzing input data based on data type. The data type may be selected from numeric, text, or categorical. In one embodiment, if the ML model is configured to accept numeric data, then the numeric data is further processed for statistical properties such as min, max, mean, distribution and variance. In the ML model is configured to accept text data, then the text data is processed for identifying new key words. Further, the ML model is configured to monitor calls for numeric data analysis with pre-processing stage inputs in case of categorical data.

The system is configured to identify impacting and non-impacting variables of the ML model. Further, the system is also configured to determine the input data impact on ML model accuracy. The system is also configured to define process to be adopted for monitoring the ML model and generate alerts for updating the ML model whenever the accuracy of the model is dropped below a predefined threshold level. Further, the system is also configured to realize scalable distributed architecture for real time model monitoring. In one embodiment, the system is configured to monitor the frequency of occurrence of erratic output by the ML model and accordingly generate model tuning and rebuilding alerts.

In one embodiment, the system is configured to analyze batch input data for different statistical properties such as min, max, variance, mean, distribution etc. Further, the system is configured to differentiate different data types such as numerical, text, categorical, audio, video and image.

Further, the system is configured to analyse text and other types of data for identifying newness (content variation) at regular time intervals. Further, the system is configured to compare actual outputs and predicted output to identify difference between the actual and model yielded outputs to generate alerts as deemed necessary.

While aspects of described system and method for generate alerts while monitoring a machine learning model in real time may be implemented in any number of different computing systems, environments, and/or configurations, the embodiments are described in the context of the following exemplary system.

Figure 1:
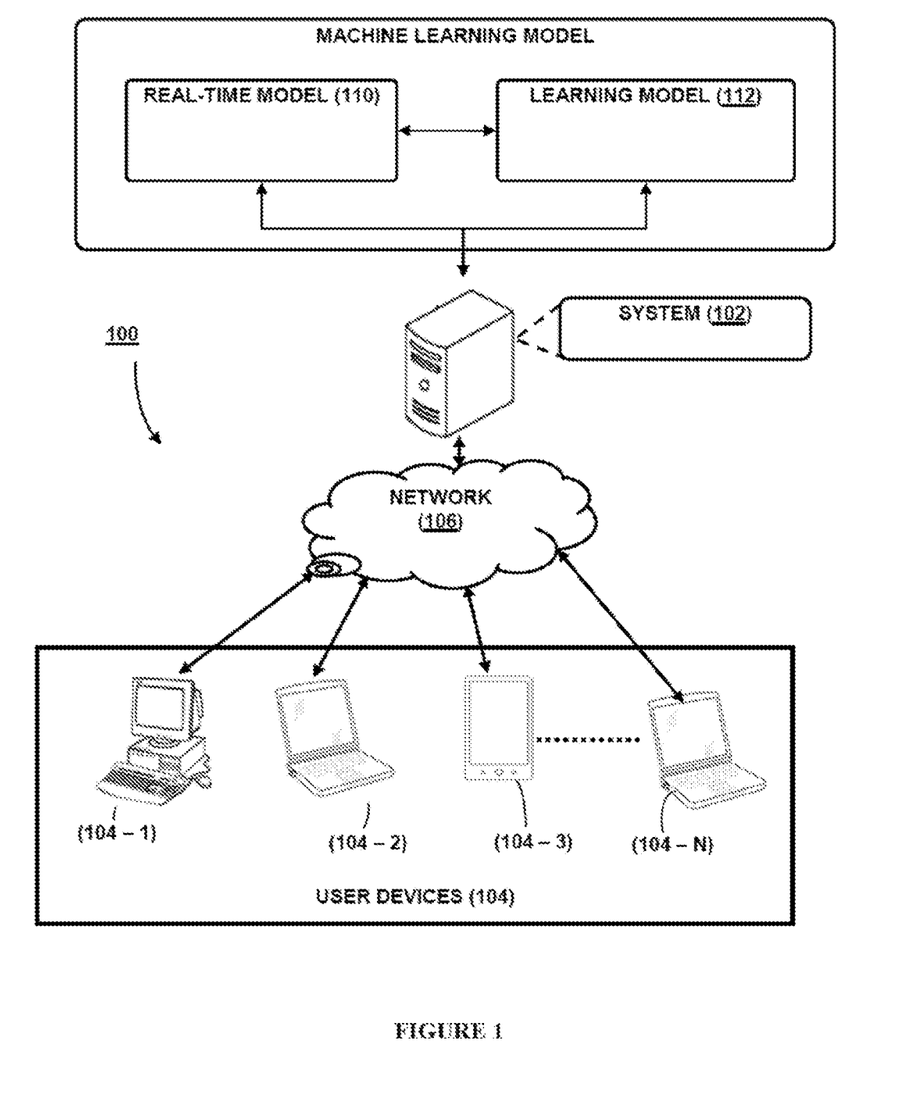
FIG. 1 illustrates a network implementation of a system configured to generate alerts while monitoring a machine learning model in real time, in accordance with an embodiment of the present subject matter.

Referring now to FIG. 1, a network implementation 100 of a system 102 to generate alerts while monitoring a machine learning model in real time is disclosed. Although the present subject matter is explained considering that the system 102 is implemented on a server, it may be understood that the system 102 may also be implemented in a variety of computing systems, such as a laptop computer, a desktop computer, a notebook, a workstation, a mainframe computer, a server, a network server, and the like. In one implementation, the system 102 may be implemented in a cloud-based environment. It will be understood that the system 102 may be accessed by a user through one or more user devices 104-1, 104-2 . . . 104-N, collectively referred to as user devices 104 hereinafter, or applications residing on the user devices 104. Examples of the user devices 104 may include, but are not limited to, a portable computer, a personal digital assistant, a handheld device, and a workstation, file server, version control servers, bugs tracking servers. The user devices 104 are communicatively coupled to the system 102 through a network 106.

In one implementation, the network 106 may be a wireless network, a wired network or a combination thereof. The network 106 can be implemented as one of the different types of networks, such as intranet, local area network (LAN), wide area network (WAN), the internet, and the like. The network 106 may either be a dedicated network or a shared network. The shared network represents an association of the different types of networks that use a variety of protocols, for example, Hypertext Transfer Protocol (HTTP), Transmission Control Protocol/Internet Protocol (TCP/IP), Wireless Application Protocol (WAP), and the like, to communicate with one another. Further the network 106 may include a variety of network devices, including routers, bridges, servers, computing devices, storage devices, and the like.

Further, the system 102 is configured to communicate with a real-time Machine Learning (ML) model hereafter referred to as real-time model 110 and a reference ML model hereafter referred to as a learning model 112. The real-time model 110 and the learning model 112 correspond to a same Machine Learning Model. In one embodiment, the learning model 112 is analogues to a reference model used as a benchmark for checking the Machine Learning Model accuracy. In one embodiment, the system 102 is configured to receive a first output parameter generated by a first function of the learning model 112. The first output parameter may be generated in response to a first input parameter received by the learning model 112. Further, the system 102 is configured to receive a second output parameter generated by a second functionality of a real-time model 110 corresponding to the machine learning model. The real-time model 110 is analogous to a production model configured to generate output based on real-time inputs. In one embodiment, the second output parameter may be generated in response to a second input parameter received by the real-time model 110.

In one embodiment, the first functionality and the second functionality are configured to perform a same function. In one example the first functionality and the second functionality may be associated with computing average rainfall for each year.

Further, the system 102 is configured to compare the first output parameter with the second output parameter to determine an output variation score. In one embodiment, the comparison is based on a data type corresponding to the first output parameter and the second output parameter. The data type corresponding to the first output parameter and the second output parameter may be selected from numeric, categorical, and text. Based on the data type, the comparison technique may be selected. For example, the comparison technique of the output parameters and the input parameters may be based on a statistical property validation technique when the data type corresponding to the output parameters and the input parameters is numeric. Further, the comparison technique for comparing the output parameters and the input parameters may be based on a label correction technique when the data type corresponding to the output parameters and the input parameters is categorical. Further, the comparison technique for comparing the output parameters and the input parameters may be based on a standard text processing when the data type corresponding to the output parameters and the input parameters is text. The system 102 may compare the first input parameter with the second input parameter to determine an input variation score. In one embodiment, the comparison is based on a data type corresponding to the first input parameter and the second input parameter. In one embodiment, the first threshold value and the second threshold value is determined based on the data type associated with the output parameters and the input parameters.

Further, the system 102 may generate a tuning alert to tune the machine learning model, when the output variation score is above a first threshold value. The tuning alert indicated that there is some change in the Machine Learning model which requires tuning for improved and accurate prediction. Further, the system 102 may generate a model rebuilding alert to rebuild the machine learning model, when the input variation score is above a second threshold value. The model rebuilding alert indicated that there is some major problem with the Machine Learning model which requires rebuilding of the Machine Learning model. In a similar manner, each function associated with the Machine Learning model is continuously monitored in real-time based on actual and predicted output and alerts are generated whenever the accuracy of the functionality goes below a predefined threshold level. The process of generate alerts while monitoring a machine learning model in real time is further elaborated with respect to FIG. 2.

Figure 2:
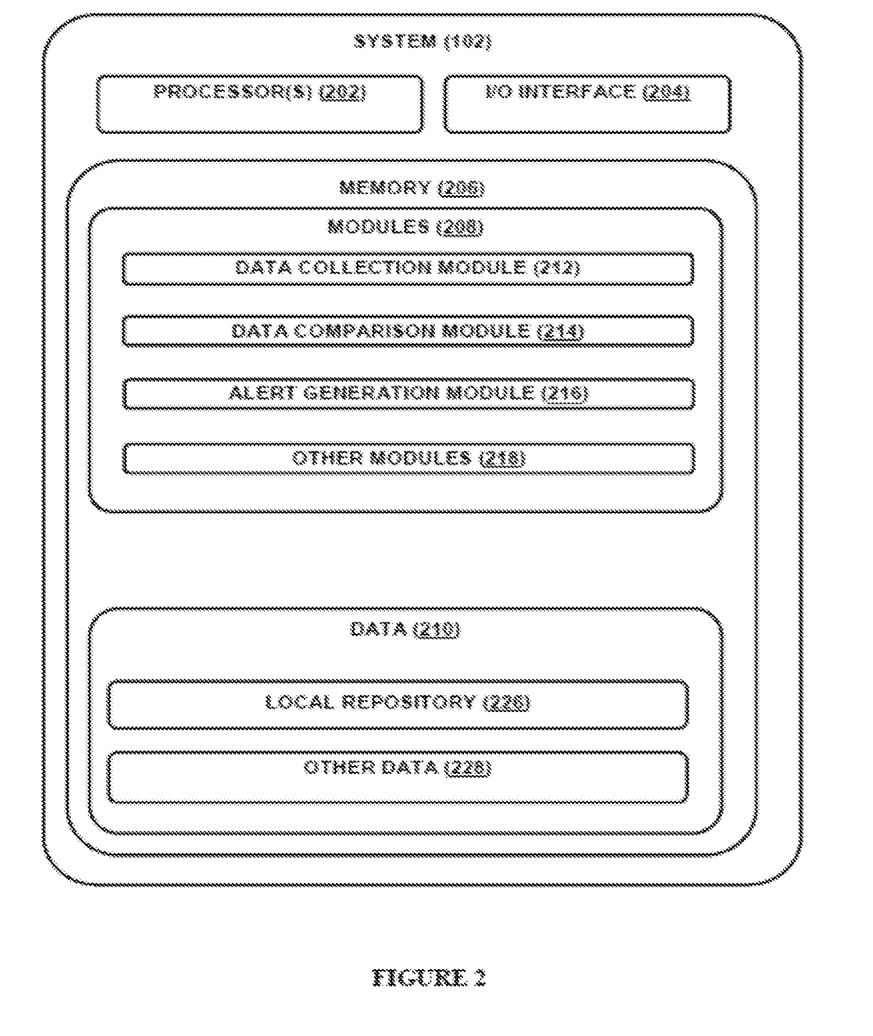
FIG. 2 illustrates the system configured to generate alerts while monitoring a machine learning model in real time, in accordance with an embodiment of the present subject matter.

Referring now to FIG. 2, the system 102 is illustrated in accordance with an embodiment of the present subject matter. In one embodiment, the system 102 may include at least one processor 202, an input/output (I/O) interface 204, and a memory 206. The at least one processor 202 may be implemented as one or more microprocessors, microcomputers, microcontrollers, digital signal processors, central processing units, state machines, logic circuitries, and/or any devices that manipulate signals based on operational instructions. Among other capabilities, the at least one processor 202 is configured to fetch and execute computer-readable instructions stored in the memory 206.

The I/O interface 204 may include a variety of software and hardware interfaces, for example, a web interface, a graphical user interface, and the like. The I/O interface 204 may allow the system 102 to interact with a user directly or through the user devices 104. Further, the I/O interface 204 may enable the system 102 to communicate with other computing devices, such as web servers and external data servers (not shown). The I/O interface 204 can facilitate multiple communications within a wide variety of networks and protocol types, including wired networks, for example, LAN, cable, etc., and wireless networks, such as WLAN, cellular, or satellite. The I/O interface 204 may include one or more ports for connecting a number of devices to one another or to another server.

The memory 206 may include any computer-readable medium known in the art including, for example, volatile memory, such as static random access memory (SRAM) and dynamic random access memory (DRAM), and/or non-volatile memory, such as read only memory (ROM), erasable programmable ROM, flash memories, hard disks, optical disks, and magnetic tapes. The memory 206 may include modules 208 and data 210.

The modules 208 include routines, programs, objects, components, data structures, etc., which perform particular tasks, functions or implement particular abstract data types. In one implementation, the modules 208 may include a data collection module 212, a data comparison module 214, an alert generation module 216, and other modules 218. The other modules 218 may include programs or coded instructions that supplement applications and functions of the system 102. The data 210, amongst other things, serves as a repository for storing data processed, received, and generated by one or more of the modules 208. The data 210 may also include a local repository 226, and other data 228. The local repository 226 is configured to store data received from the real-time model 110 and learning model 112.

In one embodiment, the data collection module 212 is configured to communicate with the real-time model 110 and the learning model 112. In one embodiment, the data collection module 212 is configured to receive a first output parameter generated by a first function of the learning model 112. The first output parameter may be generated in response to a first input parameter received by the learning model 112. Further, the data collection module 212 is configured to receive a second output parameter generated by a second functionality of a real-time model 110 corresponding to the machine learning model. In one embodiment, the second output parameter may be generated in response to a second input parameter received by the real-time model 110. In one embodiment, the first functionality and the second functionality are configured to perform a same function.

Further, the data comparison module 214 is configured to compare the first output parameter with the second output parameter to determine an output variation score. In one embodiment, the comparison may be based on a data type corresponding to the first output parameter and the second output parameter. The data type corresponding to the first output parameter and the second output parameter may be selected from numeric, categorical, and text. Based on the data type, the comparison technique may be selected. For example, the comparison technique of the output parameters and the input parameters may be based on a statistical property validation technique when the data type corresponding to the output parameters and the input parameters is numeric. Further, the comparison technique for comparing the output parameters and the input parameters may be based on a label correction technique when the data type corresponding to the output parameters and the input parameters is categorical. Further, the comparison technique for comparing the output parameters and the input parameters may be based on a standard text processing when the data type corresponding to the output parameters and the input parameters is text. The data comparison module 214 may compare the first input parameter with the second input parameter to determine an input variation score. In one embodiment, the comparison may be based on a data type corresponding to the first input parameter and the second input parameter. In one embodiment, the first threshold value and the second threshold value may be determined based on the data type associated with the output parameters and the input parameters.

Further, the alert generation module 216 may generate a tuning alert to tune the machine learning model, when the output variation score is above a first threshold value. The tuning alert indicated that there is some minor error in the Machine Learning model which requires tuning for improved and accurate prediction. Further, the alert generation module 216 may generate a model rebuilding alert to rebuild the machine learning model, when the input variation score is above a second threshold value. The model rebuilding alert indicated that there is some major problem with the Machine Learning model which requires rebuilding of the Machine Learning model. The method for generate alerts while monitoring a machine learning model in real time is further illustrated with respect to the block diagram of FIG. 3.

Figure 3:
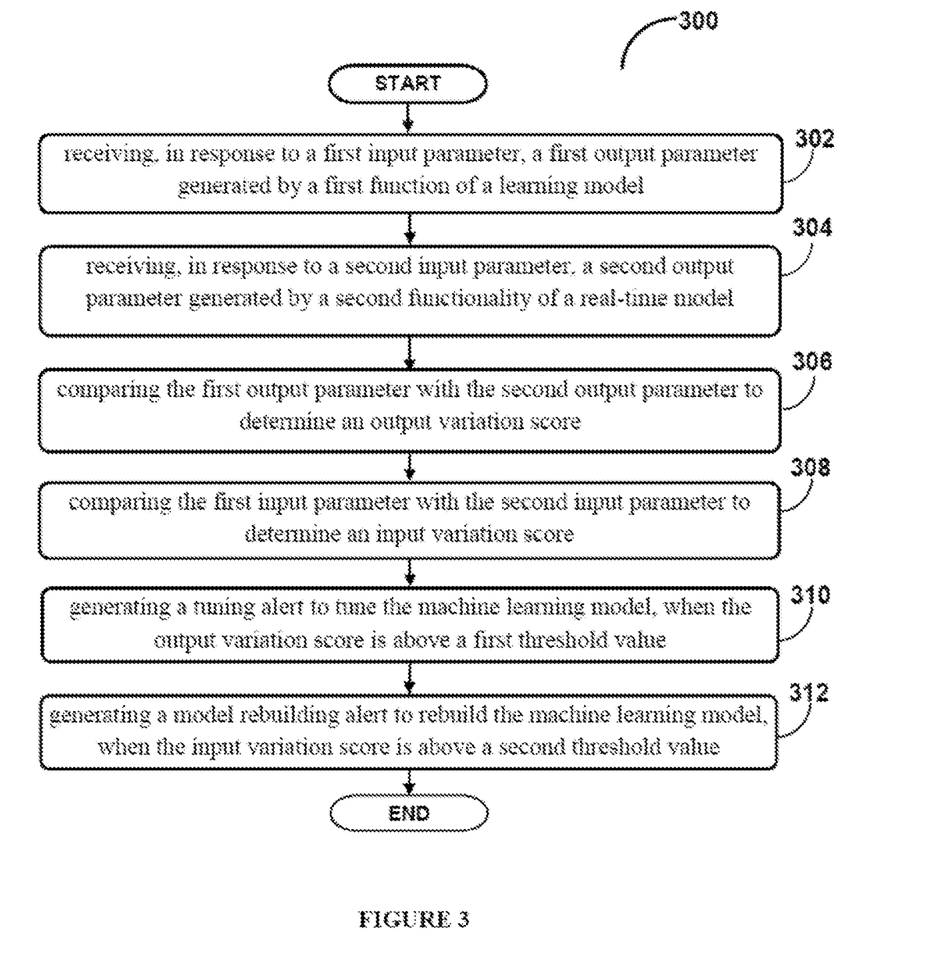
FIG. 3 illustrates a flow diagram to generate alerts while monitoring a machine learning model in real time, in accordance with an embodiment of the present subject matter.

Referring now to FIG. 3, a method 300 to generate alerts while monitoring a machine learning model in real time is disclosed, in accordance with an embodiment of the present subject matter. The method 300 may be described in the general context of computer executable instructions. Generally, computer executable instructions can include routines, programs, objects, components, data structures, procedures, modules, functions, and the like, that perform particular functions or implement particular abstract data types. The method 300 may also be practiced in a distributed computing environment where functions are performed by remote processing devices that are linked through a communications network. In a distributed computing environment, computer executable instructions may be located in both local and remote computer storage media, including memory storage devices.

The order in which the method 300 is described is not intended to be construed as a limitation, and any number of the described method blocks can be combined in any order to implement the method 300 or alternate methods. Additionally, individual blocks may be deleted from the method 300 without departing from the spirit and scope of the subject matter described herein. Furthermore, the method 300 can be implemented in any suitable hardware, software, firmware, or combination thereof. However, for ease of explanation, in the embodiments described below, the method 300 may be considered to be implemented in the above described system 102.

At block 302, the data collection module 212 is configured to communicate with the real-time model 110 and the learning model 112. In one embodiment, the learning model 112 is analogues to a reference model used as a benchmark for checking the Machine Learning Model accuracy. In one embodiment, the data collection module 212 is configured to receive a first output parameter generated by a first function of the learning model 112. The first output parameter may be generated in response to a first input parameter received by the learning model 112.

At block 304, the data collection module 212 is configured to receive a second output parameter generated by a second functionality of a real-time model 110 corresponding to the machine learning model. The real-time model 110 is analogous to a production model configured to generate output based on real-time inputs. In one embodiment, the second output parameter may be generated in response to a second input parameter received by the real-time model 110. In one embodiment, the first functionality and the second functionality are configured to perform a same function.

At block 306, the data comparison module 214 is configured to compare the first output parameter with the second output parameter to determine an output variation score. In one embodiment, the comparison may be based on a data type corresponding to the first output parameter and the second output parameter. The data type corresponding to the first output parameter and the second output parameter may be selected from numeric, categorical, and text. Based on the data type, the comparison technique may be selected. For example, the comparison technique of the output parameters and the input parameters may be based on a statistical property validation technique when the data type corresponding to the output parameters and the input parameters is numeric. Further, the comparison technique for comparing the output parameters and the input parameters may be based on a label correction technique when the data type corresponding to the output parameters and the input parameters is categorical. Further, the comparison technique for comparing the output parameters and the input parameters may be based on a standard text processing when the data type corresponding to the output parameters and the input parameters is text.

At block 308, the data comparison module 214 may compare the first input parameter with the second input parameter to determine an input variation score. In one embodiment, the comparison may be based on a data type corresponding to the first input parameter and the second input parameter. In one embodiment, the first threshold value and the second threshold value may be determined based on the data type associated with the output parameters and the input parameters.

At block 310, the alert generation module 216 may generate a tuning alert to tune the machine learning model, when the output variation score is above a first threshold value. The tuning alert indicated that there is some minor error in the Machine Learning model which requires tuning for improved and accurate prediction.

At block 312, the alert generation module 216 may generate a model rebuilding alert to rebuild the machine learning model, when the input variation score is above a second threshold value. The model rebuilding alert indicated that there is some major problem with the Machine Learning model which requires rebuilding of the Machine Learning model.

Although implementations for methods and systems for generating alerts to update a machine learning model while monitoring in real time has been described, it is to be understood that the appended claims are not necessarily limited to the specific features or methods described. Rather, the specific features and methods are disclosed as examples of implementations for generate alerts while monitoring a machine learning model in real time.

We claim:
1. A method of monitoring and updating a machine learning model in real time, the method comprising steps of:
monitoring, by a processor, a Machine Learning (ML) model in real-time, wherein the ML model is configured to generate a first output parameter generated by a first function of a learning model corresponding to a machine learning model, in response to a first input parameter, and wherein the machine learning model is also configured to generate a second output parameter generated by a second functionality of a real-time model corresponding to the machine learning model, in response to a second input parameter, wherein a first functionality and the second functionality are configured to perform a same function;

determining, through the processor, each of:
- an output variation score between the first output parameter and the second output parameter, wherein the output variation score is determined based on a comparison of a data type corresponding to the first output parameter and the second output parameter; and
- an input variation score between the first input parameter with the second input parameter, wherein the input variation score is determined based on a comparison of a data type corresponding to the first input parameter and the second input parameter;
  - wherein the comparison of the data type is performed using a comparison technique selected based on the data type;
  - wherein data type corresponding to the first output parameter, the second output parameter, the first input parameter, and the second input parameter is selected from at least one of a numeric, categorical, and text; and
  - wherein the comparison technique is selected from a statistical property validation technique, a label correction technique, and a standard text processing, based on the data type being at least one of the numeric, the categorical, and the text; and generating, by the processor:
- a tuning alert to tune the machine learning model, based on the output variation score being above a first threshold value, wherein the tuning alert indicates a required change for tuning the machine learning model, and wherein the first threshold value is determined based on the data type associated with the first output parameter and the second output parameter; and
- a model rebuilding alert to rebuild the machine learning model, based on the input variation score being above a second threshold value, wherein the model rebuilding alert indicates a problem with the machine learning model requiring rebuilding of the machine learning model, and wherein the second threshold value is determined based on the data type associated with the first input parameter and the second input parameter.

2. The method of claim 1, wherein the comparison of the output parameters and the input parameters is based on a statistical property validation technique when the data type corresponding to the output parameters and the input parameters is numeric, wherein the comparison of the output parameters and the input parameters is based on a label correction technique when the data type corresponding to the output parameters and the input parameters is categorical, and wherein the comparison of the output parameters and the input parameters is based on a standard text processing when the data type corresponding to the output parameters and the input parameters is text.

3. A system for monitoring and updating a machine learning model in real time, the system comprising:
a memory;
a processor coupled to the memory, wherein the processor is configured to execute programmed instructions stored in the memory for:

monitoring, a Machine Learning (ML) model in real-time, wherein the ML model is configured to generate a first output parameter generated by a first function of a learning model corresponding to a machine learning model, in response to a first input parameter, and wherein the machine learning model is also configured to generate a second output parameter generated by a second functionality of a real-time model corresponding to the machine learning model, in response to a second input parameter, wherein a first functionality and the second functionality are configured to perform a same function;

determining, through the processor, each of:
- an output variation score between the first output parameter and the second output parameter, wherein the output variation score is determined based on a comparison of a data type corresponding to the first output parameter and the second output parameter; and
- an input variation score between the first input parameter with the second input parameter, wherein the input variation score is determined based on a comparison of a data type corresponding to the first input parameter and the second input parameter;
  - wherein the comparison of the data type is performed using a comparison technique selected based on the data type;
  - wherein data type corresponding to the first output parameter, the second output parameter, the first input parameter, and the second input parameter is selected from at least one of a numeric, categorical, and text; and
  - wherein the comparison technique is selected from a statistical property validation technique, a label correction technique, and a standard text processing, based on the data type being at least one of the numeric, the categorical, and the text; and generating, by the processor:
- a tuning alert to tune the machine learning model, based on the output variation score being above a first threshold value, wherein the tuning alert indicates a required change for tuning the machine learning model, and wherein the first threshold value is determined based on the data type associated with the first output parameter and the second output parameter; and
- a model rebuilding alert to rebuild the machine learning model, based on the input variation score being above a second threshold value, wherein the model rebuilding alert indicates a problem with the machine learning model requiring rebuilding of the machine learning model, and wherein the second threshold value is determined based on the data type associated with the first input parameter and the second input parameter.

4. The system of claim 3, wherein the comparison of the output parameters and the input parameters is based on a statistical property validation technique when the data type corresponding to the output parameters and the input parameters is numeric, wherein the comparison of the output parameters and the input parameters is based on a label correction technique when the data type corresponding to the output parameters and the input parameters is categorical, and wherein the comparison of the output parameters and the input parameters is based on a standard text processing when the data type corresponding to the output parameters and the input parameters is text.

5. A non-transitory computer readable medium embodying a program executable in a computing device for monitoring and updating a machine learning model in real time, the computer program product comprising:

a program code for monitoring, a Machine Learning (ML) model in real-time, wherein the ML model is configured to generate a first output parameter generated by a first function of a learning model corresponding to a machine learning model, in response to a first input parameter, and wherein the machine learning model is further configured to generate a second output parameter generated by a second functionality of a real-time model corresponding to the machine learning model in response to a second input parameter, wherein the first functionality and the second functionality are configured to perform a same function;

a program code for determining, through the processor, each of:

an output variation score between the first output parameter and the second output parameter, wherein the output variation score is determined based on a comparison of a data type corresponding to the first output parameter and the second output parameter; and an input variation score between the first input parameter with the second input parameter, wherein the input variation score is determined based on a comparison of a data type corresponding to the first input parameter and the second input parameter;

wherein the comparison of the data type is performed using a comparison technique selected based on the data type;

wherein data type corresponding to the first output parameter, the second output parameter, the first input parameter, and the second input parameter is selected from at least one of a numeric, categorical, and text; and wherein the comparison technique is selected from a statistical property validation technique, a label correction technique, and a standard text processing, based on the data type being at least one of the numeric, the categorical, and the text; and a program code for generating, by the processor:

a tuning alert to tune the machine learning model, based on the output variation score being above a first threshold value, wherein the tuning alert indicates a required change for tuning the machine learning model, and wherein the first threshold value is determined based on the data type associated with the first output parameter and the second output parameter; and a model rebuilding alert to rebuild the machine learning model, based on the input variation score being above a second threshold value, wherein the model rebuilding alert indicates a problem with the machine learning model requiring rebuilding of the machine learning model, and wherein the second threshold value is determined based on the data type associated with the first input parameter and the second input parameter.

* * * * *